United States Patent [19]

Iranmanesh et al.

[11] Patent Number: 4,800,171

[45] Date of Patent: Jan. 24, 1989

[54] METHOD FOR MAKING BIPOLAR AND CMOS INTEGRATED CIRCUIT STRUCTURES

[75] Inventors: Ali Iranmanesh, San Antonio, Tex.; Mammen Thomas, San Jose, Calif.

[73] Assignee: Advanced Micro Devices, Inc., Sunnyvale, Calif.

[21] Appl. No.: 104,459

[22] Filed: Oct. 2, 1987

[51] Int. Cl.[4] .......................................... H01L 21/365
[52] U.S. Cl. ...................................... 437/31; 437/33; 437/162; 437/186; 437/233; 437/228; 156/653; 156/657; 357/34; 357/59; 148/DIG. 10; 148/DIG. 11; 148/DIG. 117; 148/DIG. 124
[58] Field of Search ..................... 437/31, 33, 69, 70, 437/162, 186, 191, 193, 228, 233; 156/653, 657, 643; 357/34, 59 H; 148/DIG. 10, DIG. 11, DIG. 117, DIG. 124

[56] References Cited

U.S. PATENT DOCUMENTS

| | | | |
|---|---|---|---|
| 4,242,791 | 1/1981 | Horng et al. | 437/70 |
| 4,318,751 | 3/1982 | Horng | 357/59 H |
| 4,381,953 | 5/1983 | Ho et al. | 437/33 |
| 4,682,409 | 7/1987 | Thomas et al. | 148/DIG. 11 |
| 4,686,763 | 8/1987 | Thomas et al. | 437/51 |
| 4,693,782 | 9/1975 | Kikuchi et al. | 437/241 |

OTHER PUBLICATIONS

Kooi et al., "Selective Oxidation . . . " Electrochem. Soc. Conf. Proc., 1973, pp. 860-879.

Primary Examiner—Brian E. Hearn
Assistant Examiner—Kevin McAndrews
Attorney, Agent, or Firm—John P. Taylor

[57] ABSTRACT

An improved method is described for constructing one or more integrated circuit components including bipolar and MOS devices on a silicon substrate without damaging areas of the substrate wherein active elements of the integrated circuit components will be formed. The method comprises forming multilayer pedestals of masking materials over the active regions of the substrate and subsequently removing these masking materials using wet etching to avoid damage to the substrate by dry etching.

19 Claims, 13 Drawing Sheets

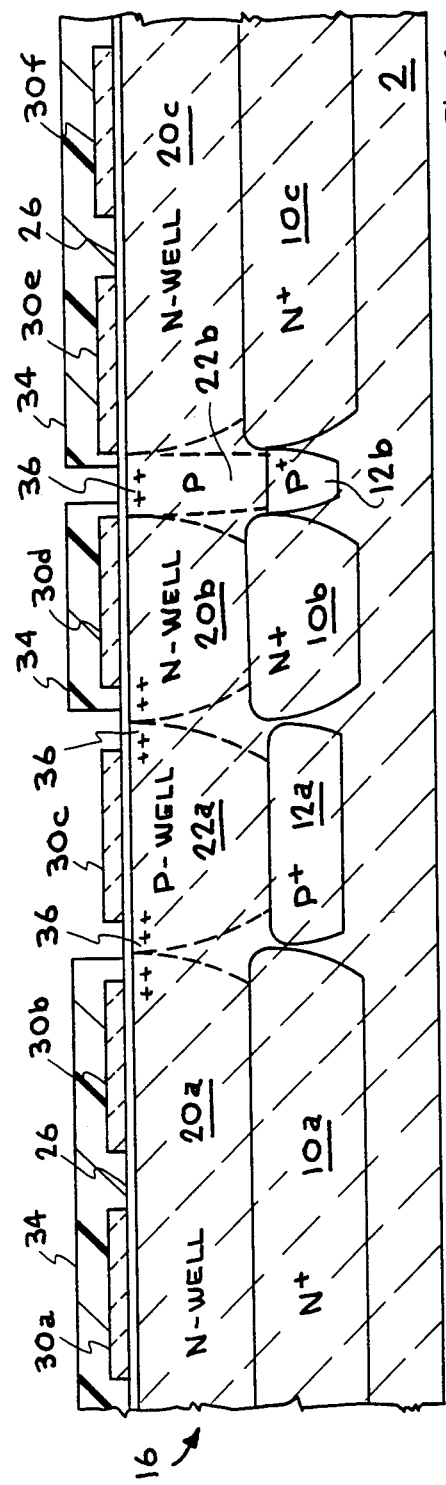
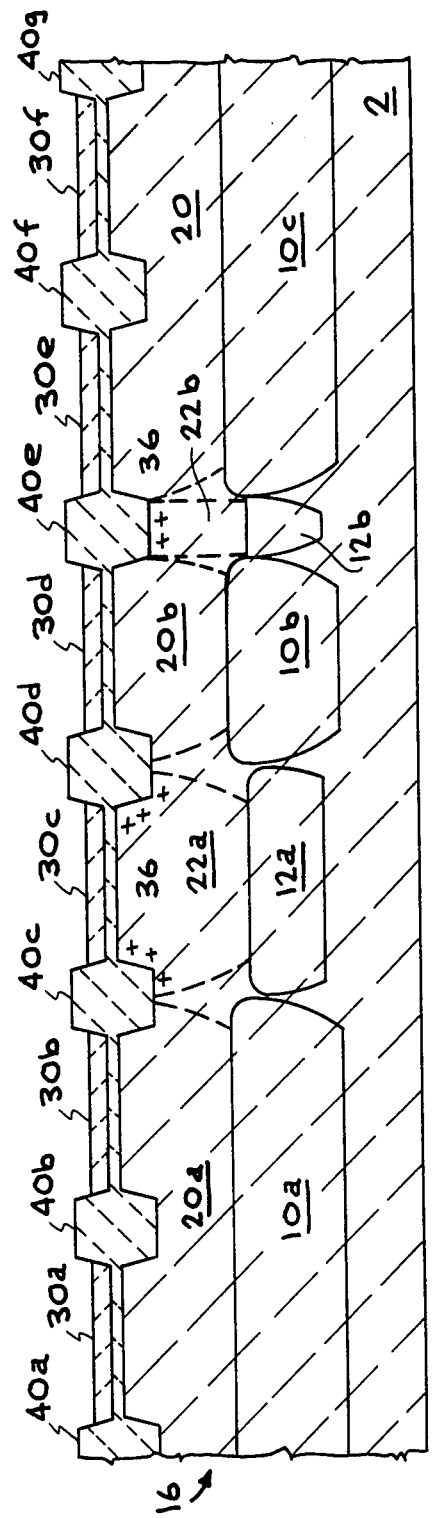

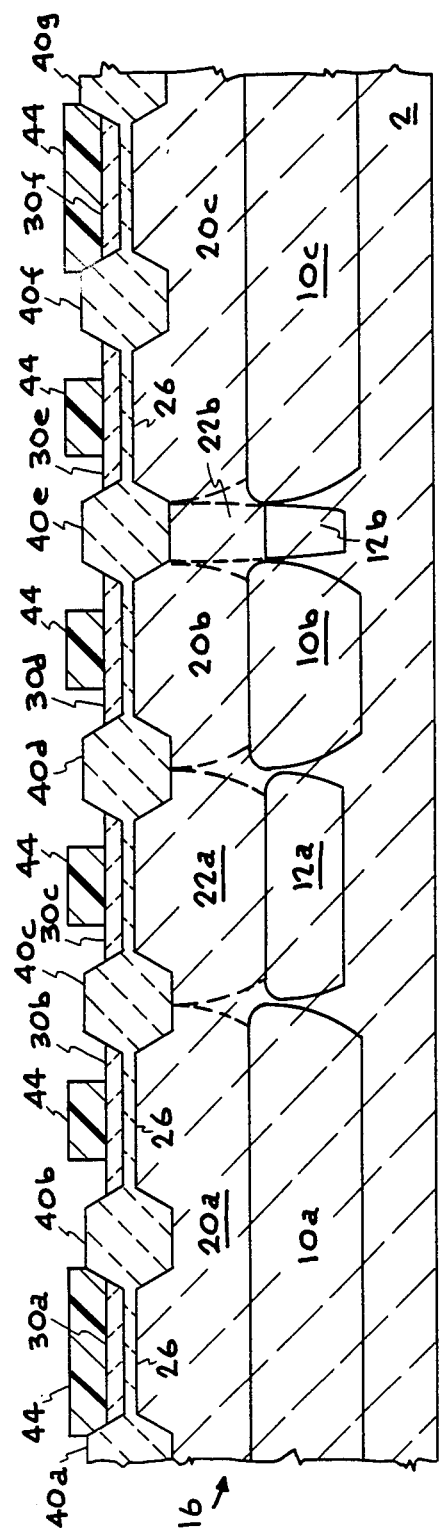
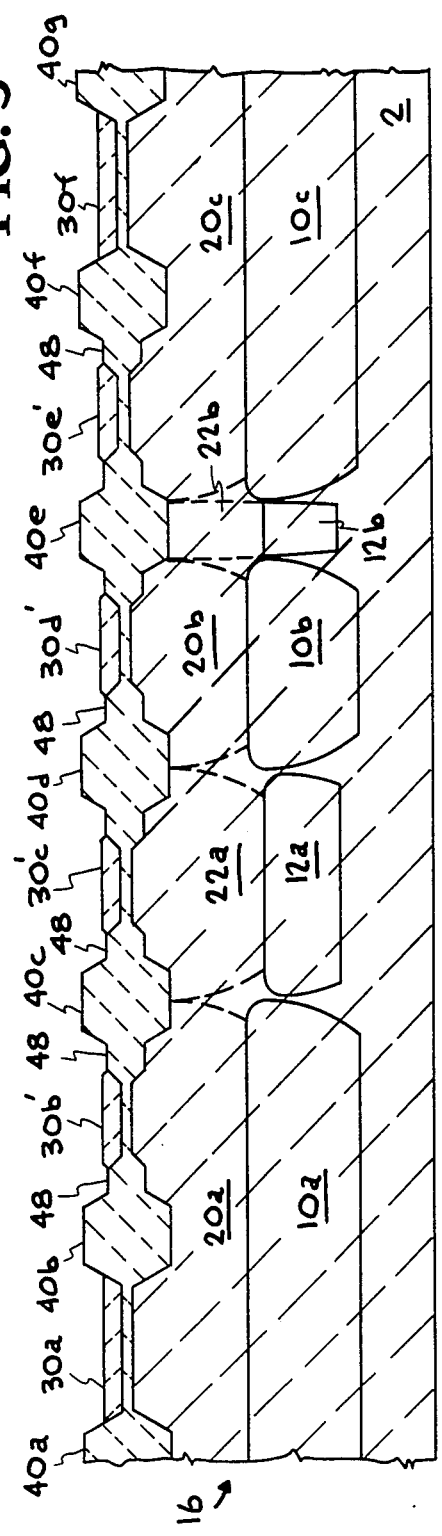
FIG. 3
FIG. 4

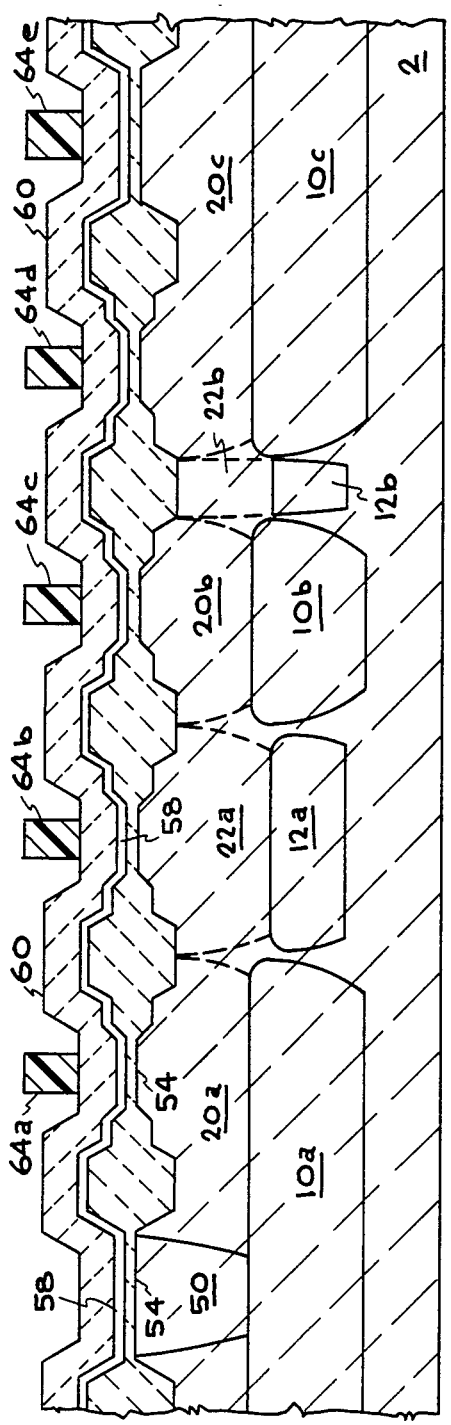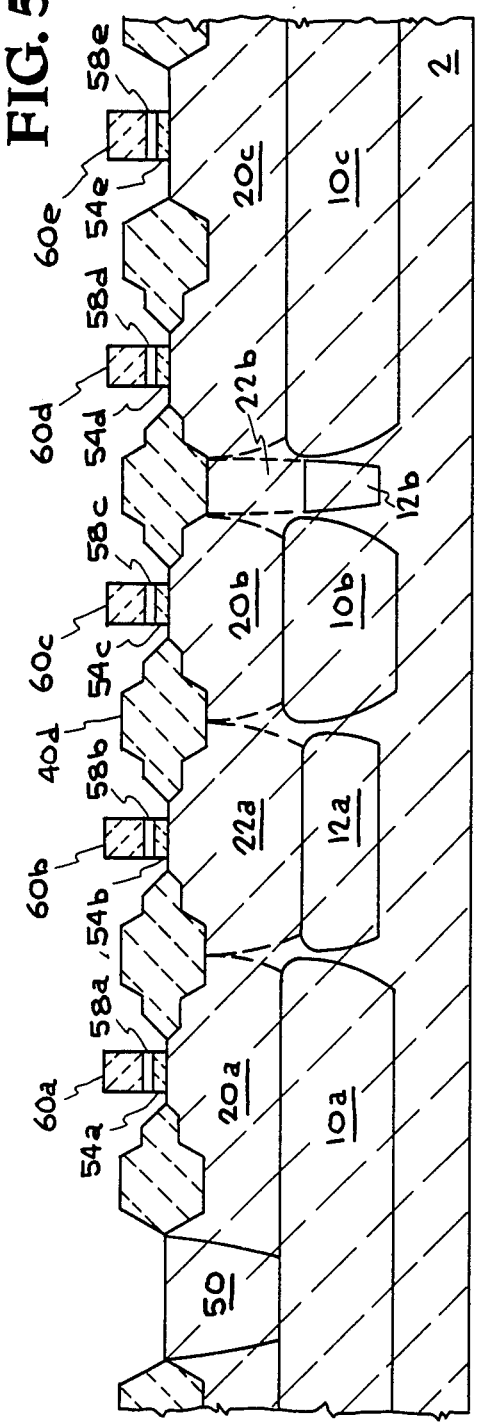

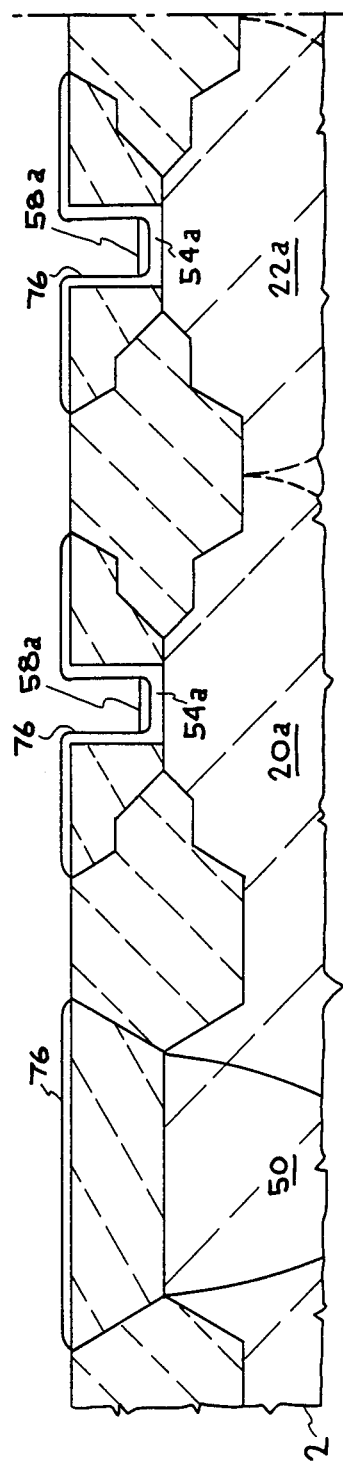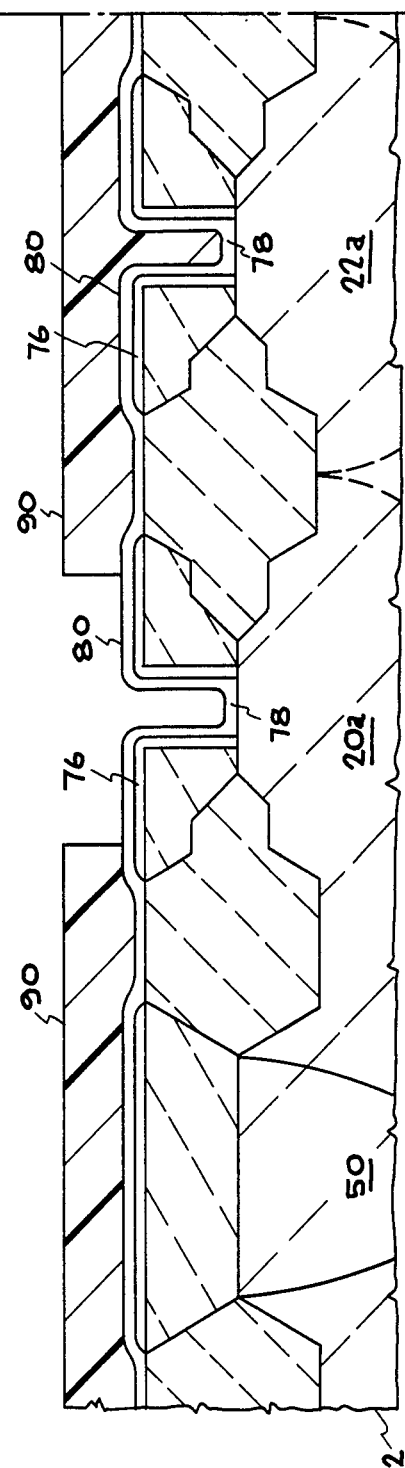

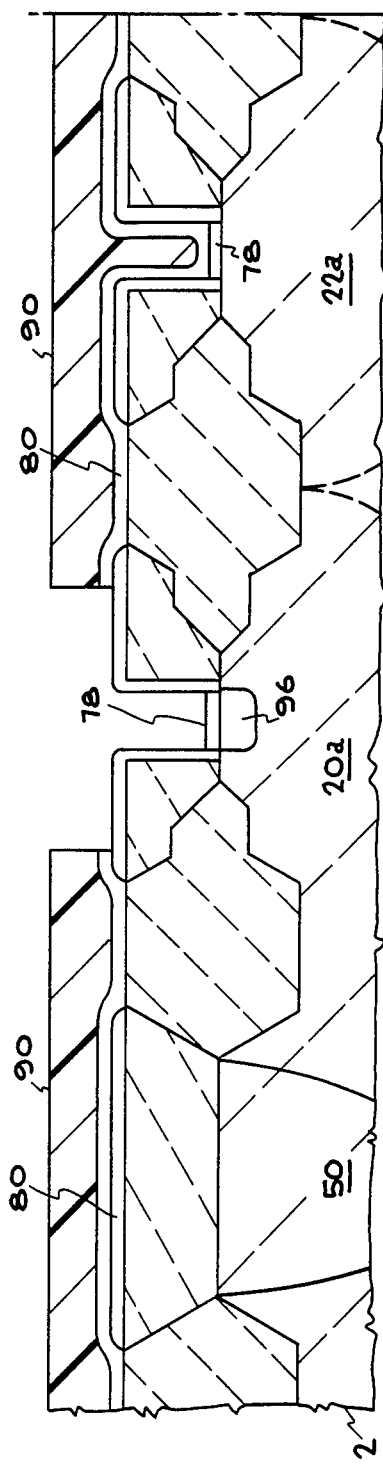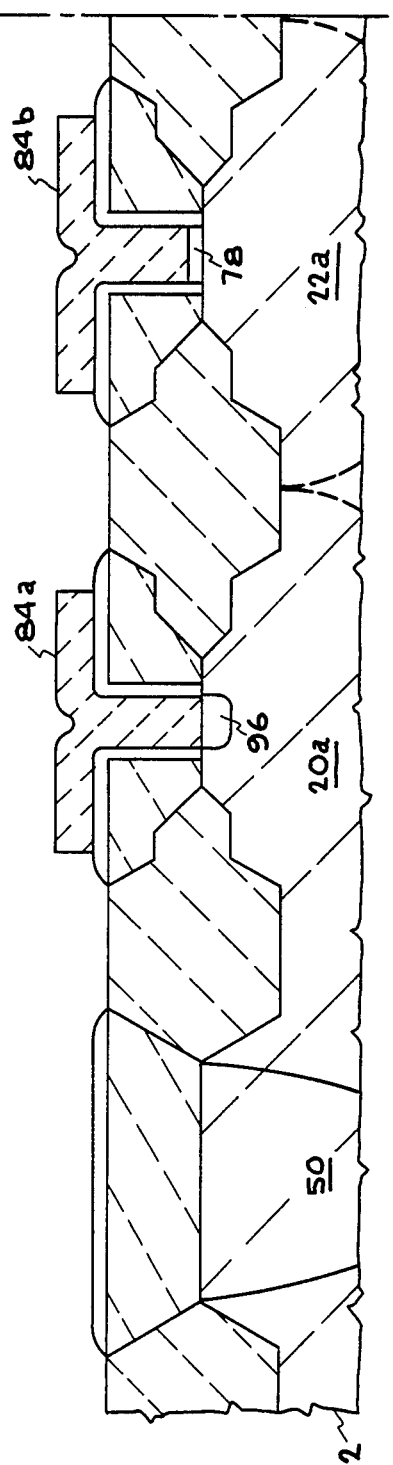

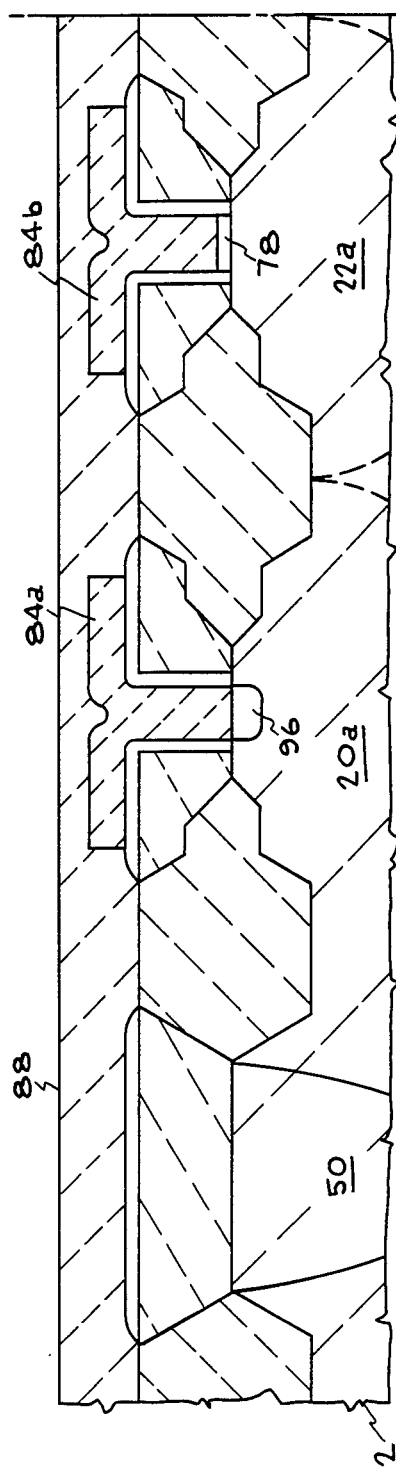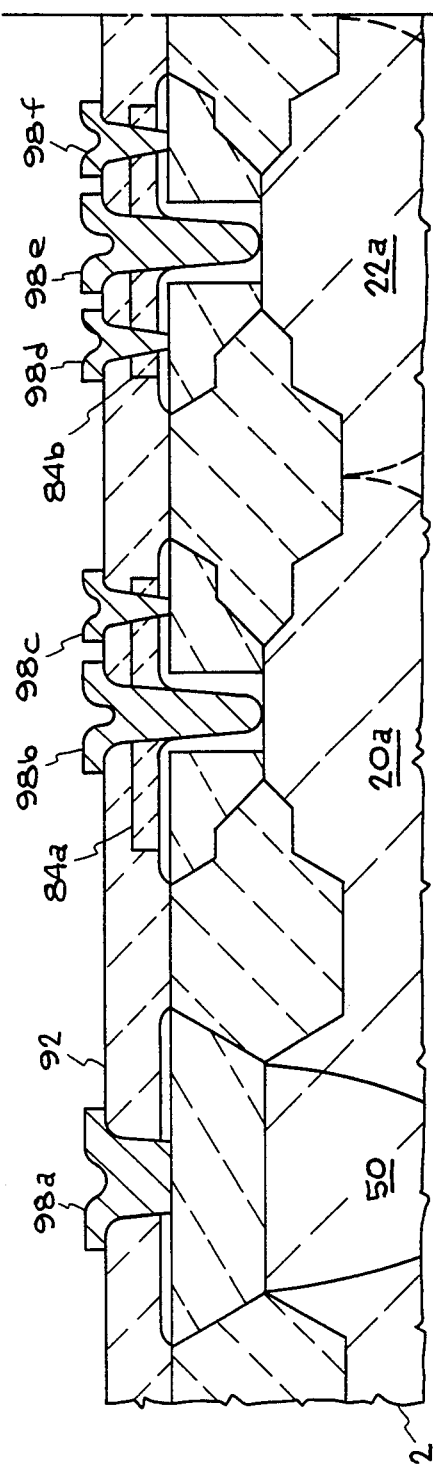

METHOD FOR MAKING BIPOLAR AND CMOS INTEGRATED CIRCUIT STRUCTURES

CROSS-REFERENCE TO RELATED APPLICATION

This application is related to Iranmanesh U.S. patent application Ser. No. 104,197, filed Oct. 2, 1987, and entitled PROCESS FOR PATTERNING FILMS IN MANUFACTURE OF INTEGRATED CIRCUIT STRUCTURES.

BACKGROUND OF THE INVENTION

1. Field of the Invention

This invention relates to an improved process for making integrated circuit structures. More particularly, this invention relates to an improved process for making the emitter and gate electrodes respectively for bipolar and CMOS integrated circuit devices as well as constructing Schottky diodes and resistors using self-aligned polysilicon and silicon oxide technology.

2. Description of the Related Art

As integrated circit structures become more complex and the density of the circuitry on chips increases, attention has been directed toward increasing the speed of individual devices used in the structure.

This, in turn, has lead to the development of processes to provide more precise alignment of the elements comprising the device, including self-alignment techniques to achieve, among other things, better control of the capacitance between elements of a device in view of the negative impact on speed which high interelectrode capacitance will produce.

Ho et al U.S. Pat. No. 4,381,953 describe a method for making a self-aligned bipolar transistor on a silicon substrate having a buried collector layer and an epitaxial layer thereon of a first conductivity type with an oxide isolation region formed between a collector sinker to the buried collector layer and the base/emitter portions of the transistor.

The Ho et al process includes the steps of depositing a doped polysilicon layer on the exposed epitaxial surface with the dopant being of opposite conductivity to the conductivity of the epitaxial layer; depositing a layer of silicon dioxide on the doped polysilicon layer; depositing a layer of photoresist on the oxide and masking off an intended intrinsic base region; using the resist as a mask, reactive ion etching away the oxide and polysilicon over the intended intrinsic base region; ion implanting the exposed intrinsic base region with ions of the first conductivity type; depositing an oxide layer on the exposed surface; reactive ion etching an emitter opening through the oxide layer and on the epitaxial surface above the implanted intrinsic base region; ion implanting the emitter region with ions of the opposite conductivity type; and then using a common heat cycle to anneal the ion implantations and drive in the emitter, intrinsic base, extrinsic base, and collector sinker.

Kayanuma et al U.S. Pat. No. 4,584,055 discloses a modified process for opening the window to the substrate for the base implant using a combination of reactive ion etching and selective wet etching to remove the overlying polysilicon using the Miller indices of the single silicon substrate to provide an etch stop for the wet etching.

While the above described processes can result in the formation of a satisfactory product, the reactive ion etching steps carried out over the emitter/base region of the substrate (or similarly, over the channel region of an MOS device, or the region of a substrate where a Schottky diode junction or a resistor will be formed) may result in damage to the substrate, including the epitaxial layer resulting in increased leakage and non-repeatable characteristics of devices fabricated in this manner. It would be desirable to form self-aligned and fast (under 200 picosecond switching) active devices, including bipolar, NMOS, and PMOS devices in an integrated circuit structure while minimizing the amount of damage done to the substrate surface by reactive ion etching techniques.

SUMMARY OF THE INVENTION

It is therefore an object of this invention to provide an improved method for constructing self-aligned integrated circuit devices in an integrated circuit structure.

It is another object of this invention to provide an improved method for constructing self-aligned integrated circuit devices in an integrated circuit structure wherein damage to the substrate by dry etching is minimized.

It is yet another object of this invention to provide an improved method for constructing self-aligned integrated circuit devices such as fast bipolar devices, MOS devices, Schottky devices, and resistors in integrated circuit structures while minimizing damage to the substrate by dry etching such as reactive ion etching.

These and other objects of the invention will be apparent from the following description and accompanying drawings.

BRIEF DESCRIPTION OF THE DRAWINGS

FIGS. 1-8 are fragmentary side-section views showing sequentially the early steps in the construction of an integrated circuit structure using one embodiment of the process of the invention.

FIGS. 9-14 are fragmentary side-section views showing sequentially the later steps in the construction of an integrated circuit structure using one embodiment of the process of the invention.

DETAILED DESCRIPTION OF THE INVENTION

Figure 7:
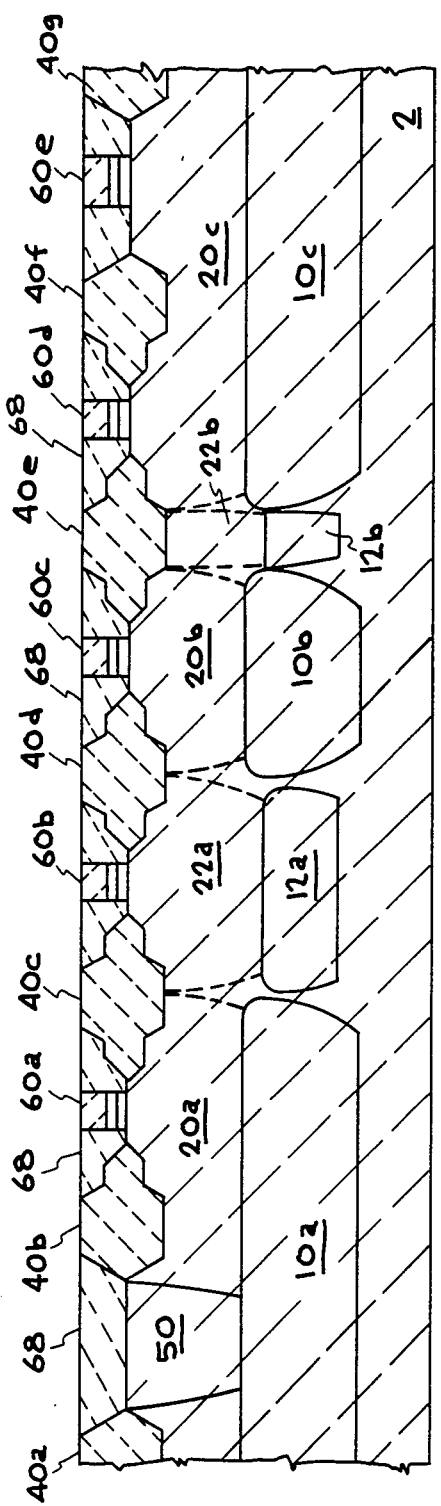

Turning now to FIG. 1, the process of the invention will be sequentially illustrated for the respective construction of a bipolar device, MOS devices, including both PMOS and NMOS, a Schottky diode, and a resistor in an integrated circuit structure. The steps generally described in connection with FIGS. 1 and 2 will be understood to be background to the actual steps of the invention and can, therefore, be substituted for by other equivalent prior art steps as will be discussed below.

A silicon substrate 2 may be initially masked and diffusion doped to form buried N+ regions 10a, 10b, and 10c therein. The mask is then removed and the substrate may be blanket implanted for P++ dopant to convert non N+ buried layer regions of substrate 2 into P+ buried layer regions 12a and 12b.

After formation of N+ buried regions 10a–10c and P+ buried regions 12a and 12b, an epitaxial layer of silicon, generally indicated by arrow 16 in FIG. 1, is grown over substrate 2. A nitride layer (not shown) is then grown over the epitaxial layer and masked to permit formation of N-wells 20a, 20b, and 20c in epitaxial layer 16 by implantation with phosphorus atoms at a concentration of about $10^{14}$ to about $10^{18}$ cm$^3$ followed by annealing as is well known to those skilled in the art.

An oxide layer (not shown) is then grown over newly formed N-wells 20a, 20b, and 20c and the remainder of the nitride layer is then removed, leaving the oxide over N-wells 20a, 20b, and 20c to function as a mask to permit formation of P-wells 22a and 22b in epitaxial layer 16 by implantation to dope the wells with a concentration of about $10^{14}$ to about $10^{18}$ atoms/cm$^3$ of B+ or BF$_2$+ ions. It will be noted that the N-wells 20a, 20b, and 20c and the P-wells 22a and 22b are generally formed respectively in registry over N+ regions 10a–10c and P+ regions 12a–12b.

The structure is then annealed and a fresh buffer oxide layer 26 grown over the entire surface followed by formation of a nitride mask comprising nitride portions 30a–30f to permit formation of the field oxide. Before growing the field oxide, however, a photoresist mask 34 is formed over N-wells 20a–20c to permit channel stop implants 36 in the regions in the P-wells beneath the subsequently formed field oxide by implantation with a dosage of about $10^{11}$ to about $10^{14}$ atoms/cm$^2$ of B+ or BF$_2$+ ions. Photoresist mask 34 is then removed and field oxide segments 40a–40g are grown to a thickness of about 6000–12000Å as shown in FIG. 2.

Turning now to FIG. 3, a photoresist mask 44 is shown applied over nitride mask portions 30a–30f followed by a nitride etch using plasma or wet etch techniques to remove the exposed parts of nitride mask portions 30b–30e to provide a capacitance reduction oxide mask. After formation of the mask, capacitance reduction oxide portions 48 may be grown over exposed portions of epitaxial layer 16 to a thickness of about 1000–2500Å.

The steps of forming photoresist mask 44, removing exposed parts of nitride mask portions 30b–30e, and growing oxide on the portion of epitaxial layer 16 exposed by removal of parts of nitride masks 30b–30e are optional steps which permit growth of what is termed herein as capacitance reduction oxide over the exposed portions of the underlying epitaxial layer as shown in FIG. 4 to reduce the collector/base capacitance and source/drain capacitance by decreasing the area of the base electrode and source/drain electrodes in contact with the substrate.

The remaining nitride mask portions 30a, 30b'–30e', and 30f, are then removed and a sinker mask (not shown) is supplied to permit formation of sinker 50 shown in FIG. 5 which is formed by implantation of the exposed portion of N-well 20a with a dosage of $10^{13}$ to $10^{18}$ atoms of phosphorus per cm$^2$ sufficient to provide a doping concentration of $10^{17}$ atoms/cm$^3$ at the lowest point vertically after annealing. This value is decided by the allowable up/down resistance of the sinker.

A buffer oxide layer 54 is then grown followed by deposition of a nitride layer 58 applied over the entire structure. This is followed by deposition of an oxide layer 60 such as Silox (undoped low temperature oxide deposition). A photoresist mask is then applied over oxide layer 60 to respectively form an emitter mask 64a, gate masks 64b and 64c, Schottky diode mask 64d, and resistor mask 64e as shown in FIG. 5.

The exposed portions of oxide layer 60 and underlying nitride layer 58 and buffer oxide 54 are then etched, respectively, with CF$_4$, SF$_6$, and CF$_4$ etches leaving pedestals defining, respectively, from left to right in FIG. 6, an emitter regions, two gate regions, a Schottky diode region, and a resistor region and comprising sandwiches of oxide segments 60a–60e over nitride segments 58a–58e and buffer oxide segments 54a–54e as seen in FIG. 6. The first etch is a selective anisotropic oxide etch which has a low etch rate on nitride. The nitride etch can be isotropic or anisotropic and the final oxide etch is again anisotropic.

A layer of polysilicon 68 is then applied over the structure and planarized by suitable means such as etching or polishing to form the structure shown in FIG. 7.

A nitride mask 70 and a photoresist mask 72 are then formed over the base/emitter portion of the bipolar device, the P channels of the MOS devices, the Schottky diode region, and the resistor region to permit implantation of the polysilicon collector contact 68a and source and drain contacts 68d and 68e of the N channel MOS device with an N+ implantation such as arsenic or phosphorus. After the implantation, photoresist mask 72 is removed and the structure is heated to 700°–1000° C. for about 20–40 minutes to anneal the implanted regions and grow about 1000–1500Å of oxide 74 over the N+ implanted regions still using nitride mask 70 to mask the remaining regions of the structure.

Nitride mask 70 is then removed by an etchant such as SF$_6$ or phosphoric acid and the now exposed base contact portions 68b and 68c, P channel MOS source and drain contact regions 68f and 68g, the Schottky diode guard ring region of substrate 2 beneath polysilicon 68h and 68i and the resistor region of substrate 2 beneath polysilicon 68j and 68k are all P+ doped by implantation with boron, e.g. with a BF$_2$+ plasma using as a mask the newly grown oxide 74 over the previously N+ implanted regions.

The structure is now exposed to an oxide etch such as HF which removes the oxide portions 74 over collector contact 68a and N channel source and drain contacts 68d and 68e as well as previously formed oxide portions 60a–60e.

Figure 8:
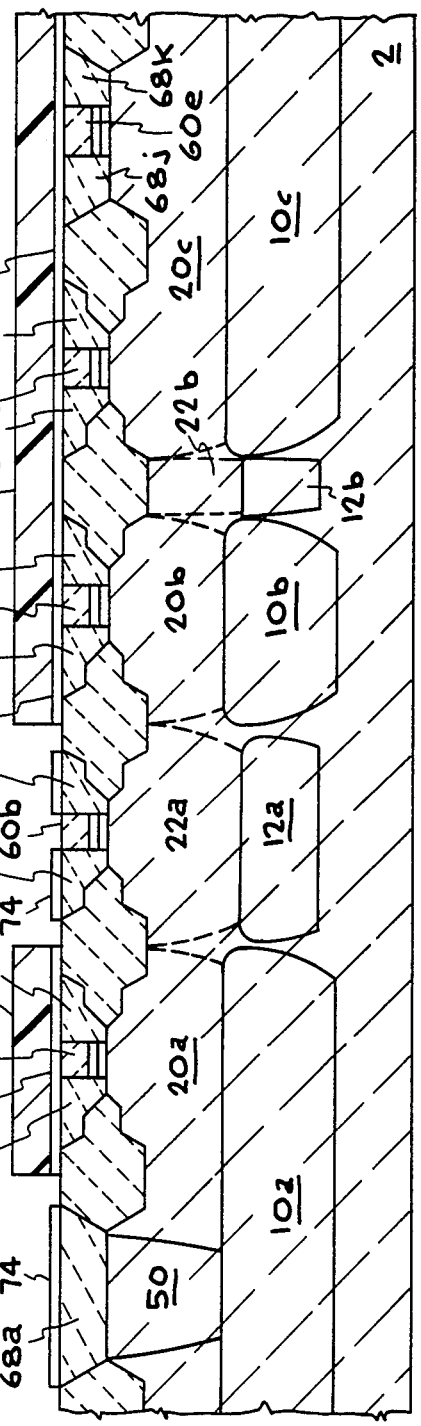
Figure 8A:
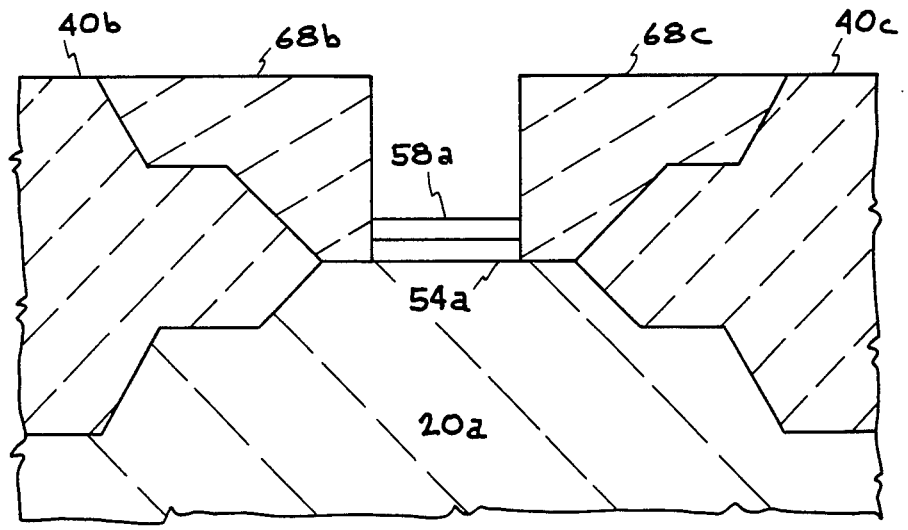
FIGS. 8A and 8B are fragmentary side-section views showing sequentially intermediate steps in the construction of an integrated circuit structure using one embodiment of the process of the invention.

Removal of oxide portions 60a–60e is best seen, with respect to removal of oxide 60a, in FIG. 8A, which depicts the base contacts 68b and 68c for the bipolar device with the oxide portion 60a defining the emitter electrode region removed and which generally also illustrates the similar structure to be found in the portions of the structure where formation of the MOS devices, Schottky diode, and resistor will be illustrated with respect to electrodes 68d–68k and the removed oxide 60a–60e.

It will be noted that while at this point oxide portions 60a–60e have been removed, underlying nitride portions 58a–58e and buffer oxide portions 54a–54e still remain. The structure may, therefore, be masked to expose and remove nitride portion 58e by etching with SF$_6$ chemistry in the region where the resistor is to be formed.

Figure 8B:
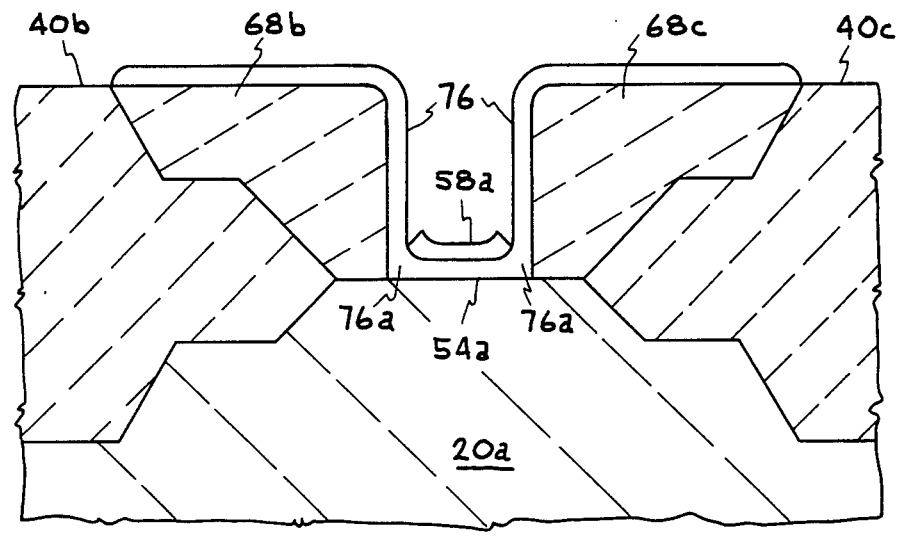

As best seen in FIG. 8B and also illustrated in FIG. 9, the exposed upper surfaces and sidewalls of the base contacts 68b and 68c (as well as the other electrodes 68d–68k) are now oxidized to provide a thin wall of oxide insulation 76 on the sidewalls of contacts 68b–68k which will electrically insulated the respective contacts, such as the base, source, and drain contacts, from the soon to be formed emitter and gate electrodes in the cases of the bipolar device and the MOS devices. Oxide portion 76b, as shown in FIG. 9, is grown on the substrate in the region where nitride mask portion 58e was removed to provide insulation over resistor 94.

All regions except the resistor region are now masked with photoresist and a boron implant is done to form the resistor body. As is well known to those skilled in the art, other dopants may be used to form the resistor in suitable wells of the opposite conductivity with the dosage varying with the value of the resistor, e.g., from $10^{11}$ to $10^{18}$ atoms/cm$^2$.

It will also be noted that during the formation of oxide 76, an oxide portion 76a, shaped not unlike a bird's beak, forms partially beneath nitride portion 58a which, in the case of the bipolar transistor, will serve to further isolate the emitter region form the extrinsic base regions of the substrate.

The nitride portions 58a-58d, which respectively remain over the emitter, gate and Schottky electrode regions, are now removed using a wet etch. This, in turn, exposes the underlying buffer oxide portions 54a-54d. These exposed oxide portions are then etched using a short etch to remove about 200-250Å of oxide About 100-200Å of further oxide is now grown over exposed oxide portions 54a-54d in a low temperature, i.e., about 750°-900° C., called KOOI oxide after which the newly grown oxide are etched away to remove the KOOI ribbon, i.e., oxides contaminated with nitrides which will not form satisfactory gate oxide. It should be noted that both the oxide etches are only carried out for a short period of time sufficient to remove about 200 to 250Å of oxide which should remove all of the oxide in the gate regions without removing a significant amount of oxide 76b above resistor region 94.

An oxide layer 78 is then grown to a thickness of about 2000-2500Å over the newly etched surfaces to form the desired gate oxide and a polysilicon layer 80 is deposited over the newly formed gate oxide to protect it from contamination. Polysilicon layer 80 is doped with phosphorus to reduce the gate resistance to saturation.

A mask 90, e.g., photoresist material, is then formed over the structure to expose only the base/emitter area. The next step is to etch the exposed portions of polysilicon layer 80 to remove it from the emitter, as shown in FIG. 11. Intrinsic base 96 is then formed in the substrate by implantation with a dosage of $5 \times 10^{11}$ to $10^{15}$ boron atoms/cm$^2$ through oxide 78.

The gate oxide 78 which was formed in the emitter area is now removed by an appropriate etch such as an HF etch. The mask 90 is then removed and a polysilicon layer, which will ultimately form the emitter and gate electrodes, is formed over the entire structure to provide about 0.1 to 0.25 microns of polysilicon for the emitter and about 0.35 to 0.5 microns for the gate electrodes. The additional thickness of the polysilicon in the gate electrode regions is due to the presence of additional polysilicon from previously formed polysilicon layer 80 which was not removed over the gates.

The structure is then implanted with arsenic or phosphorus to achieve a concentration of $10^{18}$ to $10^{21}$ atoms/cm$^3$ in the polysilicon. A polysilicon definition mask is applied to define emitter electrode 84a and gate electrodes 84b-84c, as shown in FIG. 12, by removing the remainder of the polysilicon layer with a plasma/wet etch. This etch removes all polysilicon from over the regions where Schottky diodes will be formed.

The structure is then heated to 700°-900° C. for about 10-20 minutes to anneal it and form a thin oxide of 100-200Å over polysilicon electrodes 84a-84c. At this point, an optional portion of the process may be carried out wherein a contact mask may be used to open the contacts through the oxide to form silicide on the contacts and on the gate and emitter polysilicon if needed.

The Schottky diode then may be formed by first applying a nitride mask 88 over the bipolar/MOS/resistor regions, as shown in FIG. 13, followed by a wet etch such as HF to remove oxide 54d to expose the underlying silicon substrate. In the case where silicide formation is to be on the gate and emitter and the contacts, the nitride mask could be used to open these regions also and the oxide etch used to remove the thin oxide over the exposed silicon substrate. The next step is a deposit of a 100-800Å layer of platinum or other metal capable of reacting with the silicon to form a silicide. The structure is then sintered to form platinum silicide electrode 89 and the remaining unreacted platinum or other siliciding metal is etched away by a selective etch such as, for example, an aqua regia etch for platinum.

The structure is now subject to conventional topside steps by depositing a 6000-10000Å oxide layer 92 over the entire structure which is then planarized. A via mask is then applied to open contacts to the respective collector, base, emitter, source, drain, and gate electrodes and a metal layer is then formed over the structure to fill the vias. This metal layer is then masked and etched to define collector metal contact 98a, emitter metal contact 98b, base metal contact 98c, source and drain metal contacts 98d, 98f, 98g, and 98i, gate metal contacts 98e and 98h, Schottky diode metal contact 98j, and resistor metal contacts 98k and 98l as shown in FIG. 14.

The structure may then be further conventionally processed with another deposited and planarized layer of oxide through which vias are formed to the underlying metal contacts. A second metal layer may then be deposited and masked to provide contact strips as needed on the structure. A final layer of topside oxide may then be formed over the structure.

Turning now to FIGS. 15-24, another embodiment of the process is illustrated. In this illustrated embodiment, only the process steps associated with constructing the bipolar transistor will be shown. However, it will be understood that the illustrated features of this embodiment with regard to the construction of the emitter without subjecting that portion of the substrate to damaging dry etching are equally applicable to the construction of the gate electrode in an MOS device as in the embodiment just described.

This embodiment of the process of the invention is also described in more detail in copending Iranmanesh U.S. patent application Ser. No. 104,197 entitled PROCESS FOR PATTERNING FILMS IN MANUFACTURE OF INTEGRATED CIRCUIT STRUCTURES filed by one of us on Oct. 2, 1987 and assigned to the assignee of this invention.

Figure 15:
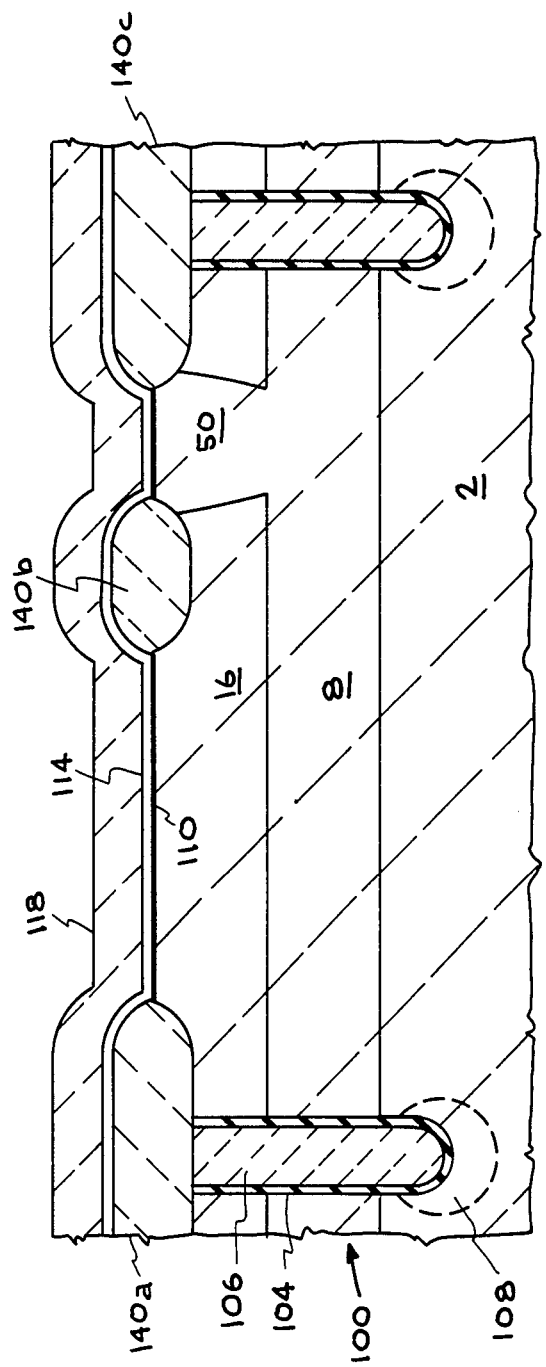
FIGS. 15-25 are fragmentary side-section views showing sequentially the steps in the construction of an integrated circuit structure using another embodiment of the process of the invention.

In FIG. 15, there is also illustrated a different form of isolation using slot oxide isolation. It will be understood that either slot oxide type isolation, the use of P wells and N wells together with field oxide, or a grown oxide isolation may be used with either embodiment of the invention. Therefore, in the sequential illustrations following FIG. 15, the slot isolation will be omitted, it being understood that some type of satisfactory isolation of the device being constructed in and on the substrate must be employed.

The structure shown in FIG. 15, except for the isolation slot which will be described below, comprises a structure which has previously been processed as described with regard to FIGS. 1 and 2 in the previous embodiment. Thus, substrate 2 already has formed therein an N+ doped buried layer 8 and an epitaxial layer 16 has been grown over buried layer 8. The structure has already been masked to permit growth of field oxide portions 140a–140c and the field oxide mask (unlike the prior embodiment, has been removed. Collector sinker 50 has also been already formed in the structure.

Isolation slot 100 shown in FIG. 15 comprises a slot or trench preferably surrounding the active device to be formed which extends into substrate 2 below buried layer 8. After formation of the slot, a boron doped region 108 is formed in substrate 2 beneath slot 100 by implantation into the slot prior to oxidation to prevent inversion/channeling. Slot 100 is lined with at least a layer 104 of isolation oxide after which the slot may be filled with any convenient filler 106 which, for example, may comprise polysilicon.

Figure 16:
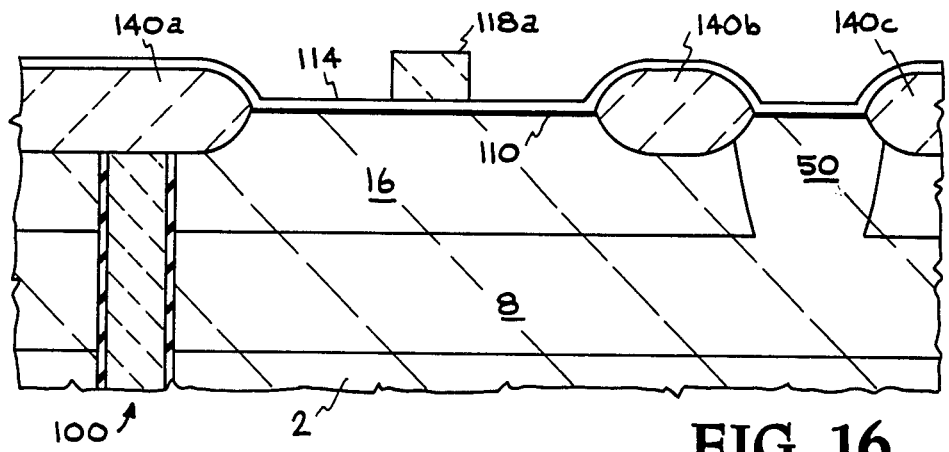

A buffer oxide layer 110, a nitride layer 114, and a 0.6 to 0.8 micron glass layer 118, e.g., silicon dioxide are sequentially formed over epitaxial layer 16 and field oxide portions 140a–140c. Glass layer 118 is then masked and etched leaving portion 118a which comprises the emitter electrode mask as shown in FIG. 16.

Figure 17:
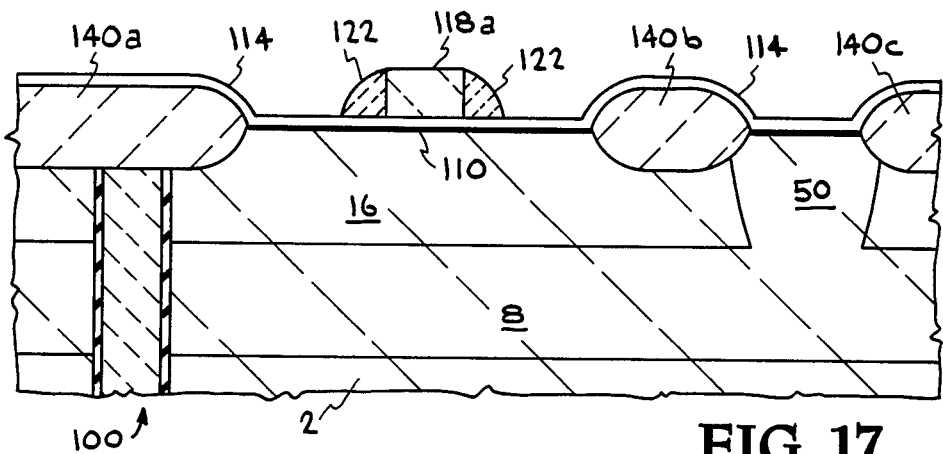
Figure 18:
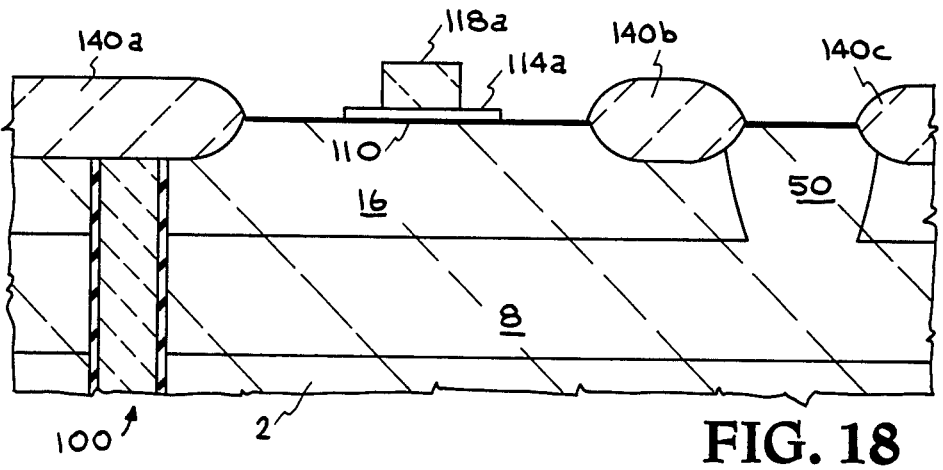

Turning now to FIG. 17, an optional capacitance reduction oxide, such as previously illustrated in FIGS. 4–14 of the prior embodiment, may be formed by first applying to the structure a layer of polysilicon having a thickness at least equal to the height of oxide mask 118a and preferably about 3000–6000Å. The structure is then subjected to a selective etch such as a reactive ion etch (RIE) to provide polysilicon spacers 122 on either side of emitter electrode mask 118a.

The remainder of nitride layer 114 is then removed using, for example, a selective etchant such as $SF_6$ plasma which will attack nitride but not polysilicon. This leaves a nitride mask portion 114a beneath emitter electrode mask 118a and polysilicon spacers 122 which may then be removed using a polysilicon etchant such as an iodine etch to form the capacitance oxide reduction mask structure shown in FIG. 18.

Figure 19:
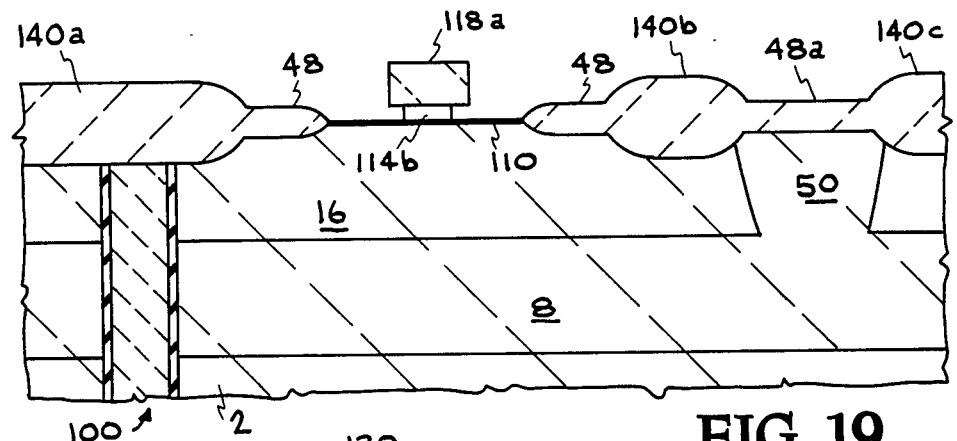

The structure is now heated in a preferably moist oxidizing atmosphere to result in the growth of about 1000 to 3000Å of oxide on the exposed surfaces to provide the capacitance reduction oxide 48 shown in FIG. 19. The exposed portion of nitride mask is then wet etched using a phosphoric acid etch which will also slightly undercut the oxide emitter electrode mask 118a leaving nitride portion 114b thereunder. The underlying buffer oxide is also removed from the non-undercut regions by a selective short plasma etch or a short 10:1 HF wet etch.

Figure 20:
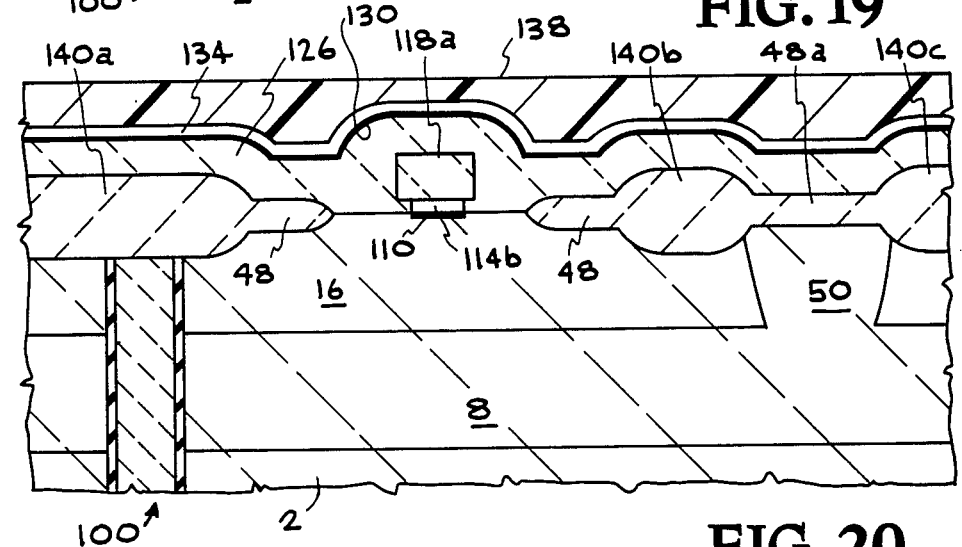

A 4000–6000Å layer of polysilicon 126 is then deposited over the entire structure followed by oxidation of the polysilicon to form a barrier or buffer oxide 130 and deposition of a 500–1500Å nitride layer 134. A layer of photoresist 138 is then applied over nitride layer 134. as shown in FIG. 20.

Figure 21:
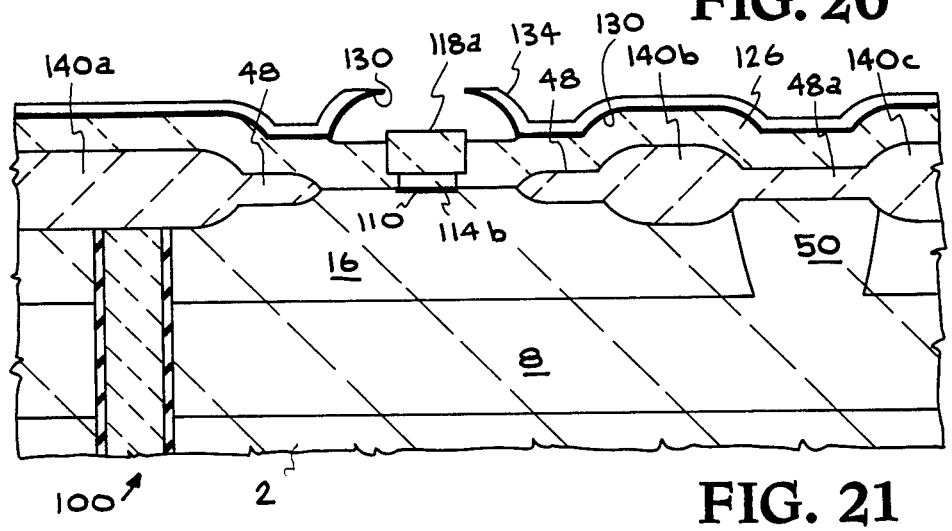
Figure 22:
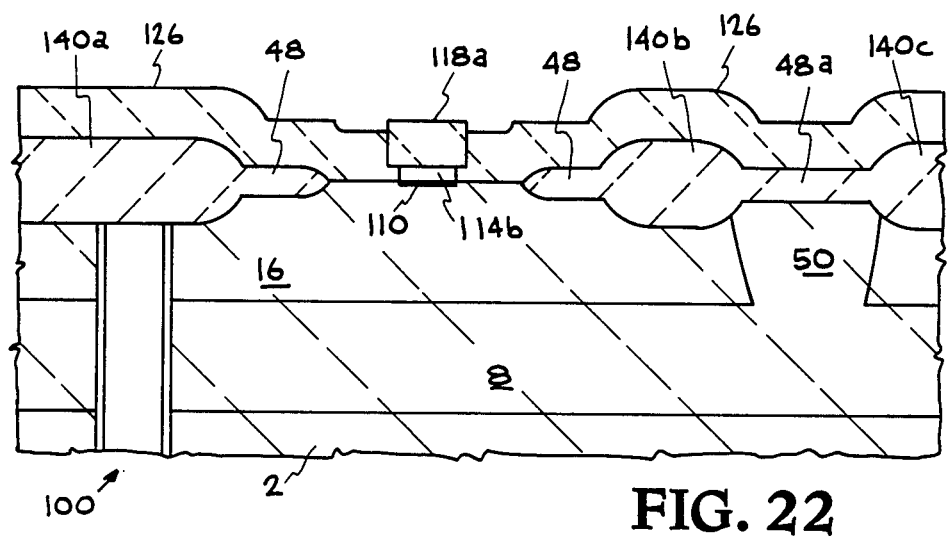

Photoresist layer 138 and nitride layer 134 are then etched with a RIE using the oxide layer 130 as a stop. The remaining portions of photoresist 134 are then stripped and the exposed oxide 130 (over the region of oxide emitter electrode mask 118a) is wet etched with HF or any other suitable oxide etchant and the polysilicon layer 126 exposed by this oxide etch is then wet etched with a suitable etchant such as KOH down to the oxide electrode emitter mask 118a as shown in FIG. 21. The remainder of nitride layer 134 is then removed by wet etching using suitable etchants as previously described resulting in the structure shown in FIG. 22.

It will be noted that in accordance with this embodiment of the invention, the processing of various layers above the region in substrate 2 where the emitter will be eventually formed utilizes wetting etching techniques rather than dry etching whenever there is a possibility that a dry etchant might penetrate through the overlying layers to reach—and damage—the substrate.

A base polysilicon implant is now made using a high dose implant of B+ or $BF_2+$ ions, i.e., about $10^{13}$ to $10^{18}$ atoms/cm$^2$, to implant a P+ extrinsic base region. The dopant is then driven into the substrate by an anneal at 650°–1050° C. for 10–40 minutes. Known fast annealing techniques can also be used for this anneal as well as other anneals described herein. This forms extrinsic base region 144 in substrate 2 beneath polysilicon layer 126 where it contacts epitaxial layer 16 of substrate 2 as shown in FIG. 23.

Figure 23:
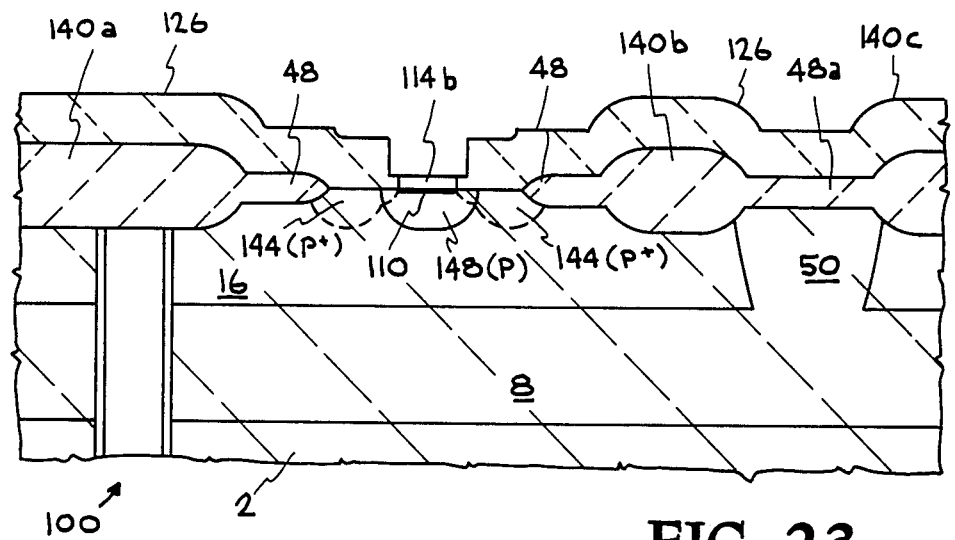

Oxide emitter electrode mask 118a is now removed with a wet etchant such as buffer oxide etch or a 10:1 HF etch and the active base region in the substrate is implanted using B+ or $BF_2+$ ions at a dosage of $10^{11}$ to $10^{16}$ atoms/cm$^2$ followed by an anneal at 650°–1000° C. for 10–30 minutes to drive in the dopant to form intrinsic base region 148 as also shown in FIG. 23.

Figure 24:
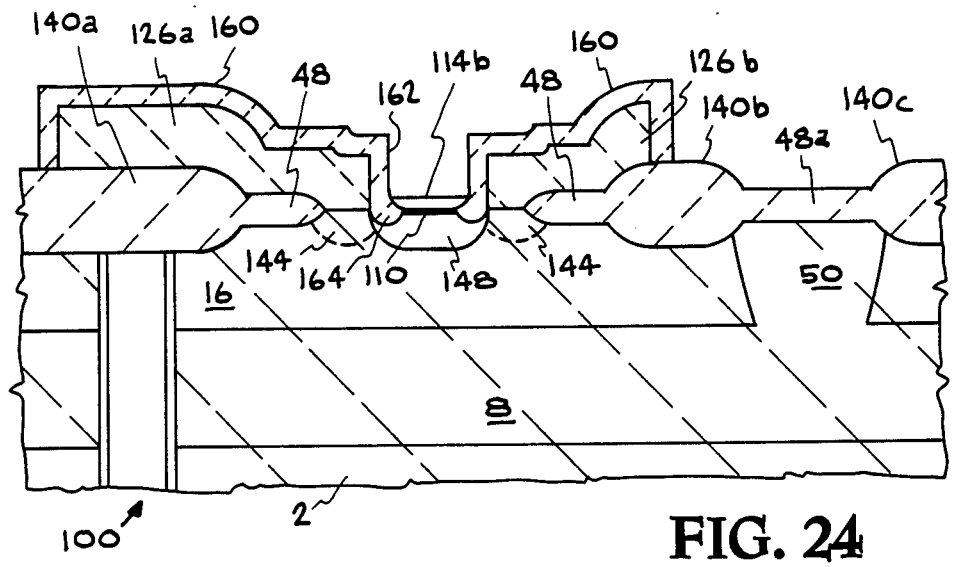

Polysilicon layer 126 is then masked and etched, preferably using a wet etchant such as iodine etch to define extrinsic base electrodes 126a and 126b. Polysilicon electrodes 126a and 126b are then oxidized preferably using a high pressure oxidation (HIPOX) at about 500°–650° C. to form an oxide layer 160 on the top of polysilicon electrodes 126a and 126b and oxide sidewalls 162 which terminate in portions 164 which partially extend beneath nitride mask portion 114b as shown in FIG. 24.

Nitride mask 114b is then removed by wet etching with a phosphonic acid etch and the underlying remaining buffer or barrier oxide 110 is also etched away in a 10:1 HF etch. The oxide etched is of very small thickness so not much of the polysilicon oxide/sidewall oxide is etched.

A 1000–3000Å layer of polysilicon is then deposited and doped by implanting with arsenic to achieve a concentration of $10^{18}$ to $10^{21}$ atoms/cm$^3$ followed by an anneal for 5–30 minutes at 650°–950° C. to drive in emitter 156 into intrinsic base region 148. The newly deposited polysilicon layer is then suitably masked and etched to form emitter electrode 152a as seen in FIG. 25.

Figure 25:
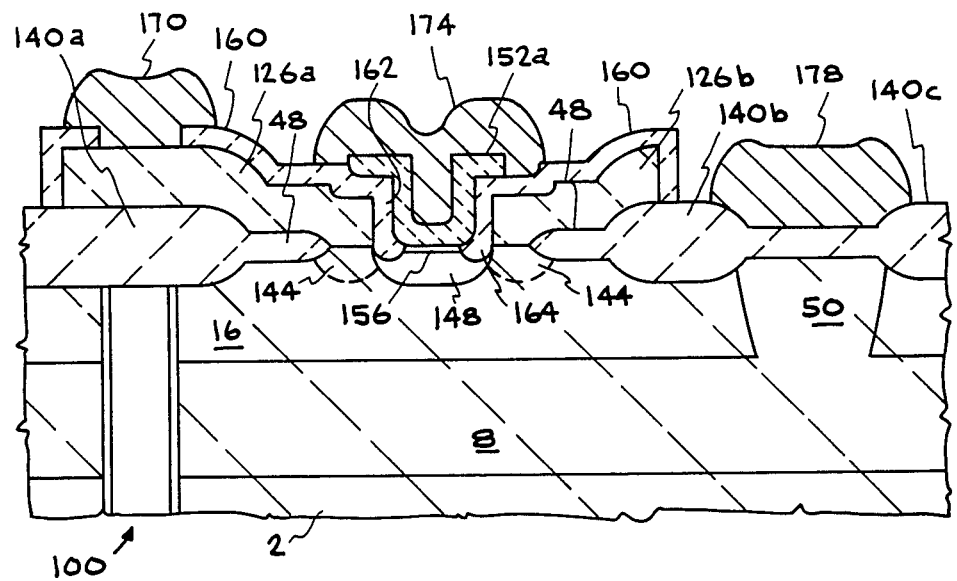

Metal electrodes to the bipolar device are then conventionally formed by first masking and etching the structure to form a base contact opening in oxide 160 and a collector contact opening in oxide 48a followed by deposition and patterning of a layer of metal such as aluminum to form base metal contact 170, emitter metal contact 174, and collector metal contact 178 as shown in FIG. 25. This is an advanced self-aligned polysilicon process (ASAP) for bipolar devices.

Thus, the invention provides an improved method of constructing integrated circuit devices with self-aligned electrodes while avoiding damage to the substrate by avoiding the use of dry etching techniques in the active areas where elements such as the emitter of a bipolar transistor or the channel of an MOS device will be formed in the substrate. While the described embodiments are intended to show various aspects of the invention, they are intended to be only by way of illustration and not of limitation of the invention which is intended to be defined by the appended claims.

What is claimed is:

1. An improved method of constructing one or more integrated circuit components including a bipolar transistor on a semiconductor substrate without damaging areas of the substrate wherein active elements of the integrated circuit components will be formed which comprises:
   (a) forming one or more isolated regions in said substrate wherein an integrated circuit device may be formed which is isolated from other devices formed in adjacent regions;
   (b) forming a collector well for a bipolar transistor in said substrate;
   (c) forming field oxide portions in the surface of said substrate to further isolate said regions from one another and to isolate said collector well from other elements of said bipolar transistor;
   (d) forming a buffer oxide layer over exposed portions of said substrate;
   (e) forming a first nitride mask layer over said buffer oxide layer;
   (f) forming a second oxide mask layer over said first nitride mask layer to permit selective etching of either mask layer;
   (g) forming a patterned photoresist mask over said second mask layer comprising a different material than the material in said first and second mask layers;
   (h) etching exposed portions of at least said second mask layer to leave one or more multilayer pedestals under said photoresist mask corresponding to one or more active regions to be formed in said substrate;
   (i) removing said photoresist mask;
   (j) forming a polysilicon layer over said structure;
   (k) planarizing said polysilicon layer to expose the top of said multilayer pedestals;
   (l) implanting dopant into portions of said polysilicon corresponding to base contact electrode portions for said bipolar transistor;
   (m) removing said second mask portion of said multilayer pedestals by wet etching to expose sidewall portions of said planarized polysilicon adjacent said multilayer pedestals; and
   (n) oxidizing said exposed sidewall portions of said polysilicon to provide an insulating layer of oxide between said polysilicon which will comprise a base contact electrode and a subsequently deposited conductive material which will function as an emitter contact electrode.

2. The method of claim 1 wherein said steps for forming said field oxide by forming said nitride mask comprise the further steps of forming a first buffer oxide layer; then forming a nitride layer; and then forming said nitride field oxide mask by removing portions of both said first buffer oxide and said nitride layer.

3. The method of claim 1 wherein said step of etching of at least said second mask layer to form said one or more pedestals includes the steps of etching said oxide mask layer with a first etchant; etching said underlying nitride mask with a second etchant which will remove nitride exposed by removal of said overlying oxide mask layer of said pedestal; and removing portions of said buffer oxide exposed by etching said nitride mask layer.

4. The method of claim 3 wherein said method includes the further steps of:
   (a) removing said first nitride mask layer from said multilayer pedestals leaving only buffer oxide over said substrate in those regions where said multilayer pedestals are removed;
   (b) implanting an intrinsic base region in said substrate through said buffer oxide;
   (c) removing said buffer oxide over said implanted intrinsic base region;
   (d) forming a layer of polysilicon over said intrinsic base region;
   (e) doping said polysilicon layer with a dopant to permit diffusion of an emitter region into said underlying intrinsic base region in said substrate;
   (f) patterning said polysilicon layer to form an emitter electrode;
   (g) diffusing an emitter region into said intrinsic base region in said substrate below said doped polysilicon emitter electrode;
   (h) forming an oxide layer over said structure; and
   (i) forming metal contacts to said respective base, collector, and emitter electrodes through said oxide layer formed thereover.

5. An improved method of constructing one or more bipolar transistors on a semiconductor substrate without damaging areas of the substrate wherein the intrinsic base and emitter regions of the bipolar 5 transistor will be formed which comprises:
   (a) forming one or more isolated regions in said substrate wherein a bipolar transistor may be formed which is isolated from other devices formed in adjacent regions;
   (b) forming a collector well for said bipolar transistor in said substrate;
   (c) forming a first nitride mask having openings therein to expose portions of said substrate to be oxidized to form field oxide portions in the surface of said substrate to further isolate said regions from one another and to isolate said collector well from other elements of said bipolar transistor;
   (d) growing said field oxide through said openings in said first nitride mask;
   (e) forming a first patterned photoresist mask over said nitride mask to expose portions of said first nitride mask ajdacent said newly formed field oxide portions;
   (f) removing said exposed first nitride mask portions;
   (g) further oxidizing said substrate to form capacitance reduction oxide portions adjacent said field oxide portions over said portions of said substrate newly exposed by removal of said first nitride mask portions;
   (h) removing the remaining portions of said first nitride mask and said first photoresist mask;
   (i) forming a buffer oxide layer over exposed portions of said substrate;
   (j) forming a second nitride mask layer over said buffer oxide layer;
   (k) forming an oxide mask layer over said second nitride mask layer to permit selective etching of either mask layer;

(l) forming a second photoresist mask over said oxide mask layer;

(m) etching exposed portions of said oxide mask layer and said underlying second nitride mask layer to leave one or more multilayer pedestals under said second photoresist mask corresponding to one or more intrinsic base and emitter regions portion of bipolar transistors to be formed in said substrate;

(n) removing said second photoresist mask;

(o) forming a polysilicon layer over said structure;

(p) planarizing said polysilicon layer to expose the top of said multilayer pedestals;

(q) implanting dopant into portions of said polysilicon corresponding to base contact electrode portions for said bipolar transistor;

(r) removing said oxide mask layer portion of said multilayer pedestals by wet etching to expose sidewall portions of said planarized polysilicon adjacent said multilayer pedestals;

(s) oxidizing said polysilicon to form an oxide coating on said exposed polysilicon sidewalls;

(t) removing said second nitride mask layer from said multilayer pedestals by wet etching leaving only buffer oxide over said substrate in those regions where said multilayer pedestals are removed;

(u) implanting an intrinsic base region in said substrate through said buffer oxide;

(v) removing said buffer oxide over said implanted intrinsic base region by wet etching;

(w) forming a second layer of polysilicon over said intrinsic base region;

(x) doping said second polysilicon layer with a dopant capable of being diffused into said intrinsic base region to form the emitter of said bipolar transistor;

(y) patterning said second polysilicon layer to form an emitter electrode;

(z) diffusing an emitter region into said intrinsic base region in said substrate below said doped polysilicon emitter electrode;

(aa) forming an oxide layer over said structure; and (bb) forming metal contacts to said respective base, collector, and emitter electrodes through said oxide layer formed thereover to form said bipolar transistor.

6. In the construction of an integrated circuit structure wherein one or more isolated regions have been previously formed in a semiconductor substrate to isolate integrated circuit devices which may be formed in adjacent isolated regions of said substrate, a collector well for a bipolar transistor has been formed in at least one of said isolated regions in said substrate, field oxide portions have been formed in the surface of said substrate to further isolate said regions from one another and to isolate said collector well from other elements of said bipolar transistor formed in the same region, and a buffer oxide layer has been formed over exposed portions of said semiconductor substrate; an improved method of constructing said integrated circuit structure without damaging areas of the substrate wherein active elements of devices and components comprising said structure will be formed, said improved method comprising:

(a) forming a first mask layer over said structure including said buffer oxide;

(b) forming a second mask layer over said first mask layer using a mask material different from said first mask to permit selective etching of either mask layer;

(c) forming a patterned photoresist mask over said second mask layer comprising a different material than the material in said first and second mask layers;

(d) etching exposed portions of at least said second mask layer to leave one or more multilayer pedestals under said photoresist mask corresponding to one or more active regions to be formed in said substrate;

(e) removing said photoresist mask;

(f) removing at least a portion of said first mask layer between said field oxide portions and said multilayer pedestals to expose portions of said buffer oxide;

(g) removing said exposed portions of said buffer oxide;

(h) forming a polysilicon layer over said structure in contact with said substrate in those areas where said buffer oxide was removed;

(i) forming a second buffer oxide layer over said polysilicon layer;

(j) forming a nitride layer over said second buffer oxide layer;

(k) forming a planarized layer of photoresist over said nitride layer;

(l) anisotropically etching said planarized photoresist layer and said underlying nitride layer until a raised portion of said second buffer oxide layer over said polysilicon layer and said multilayer pedestal is exposed;

(m) removing said photoresist layer;

(n) wet etching said exposed portion of said second buffer oxide layer over said polysilicon layer and said multilayer pedestal to expose said underlying polysilicon;

(o) wet etching the portion of said polysilicon layer exposed by said wet etching of said second buffer oxide layer to expose said multilayer pedestal;

(p) removing the remainder of said nitride layer;

(q) removing said second mask layer portion of said multilayer pedestals to expose adjacent sidewalls portions of said polysilicon layer; and (r) oxidizing said exposed sidewall portions of said polysilicon to provide an insulating layer of oxide between said polysilicon which will comprise a base contact electrode and a subsequently deposited conductive material which will function as an emitter contact electrode.

7. The method of claim 6 including the further steps of forming a capacitance reduction oxide on said substrate adjacent said field oxide to reduce the base/collector capacitance which comprises:

(a) forming a layer of polysilicon over said structure after etching said second mask to form said multilayer pedestals;

(b) selectively etching said polysilicon layer to leave rounded spacers adjacent said pedestals;

(c) removing the exposed portion of said first mask layer with a selective etchant which will not substantially attack said remaining portions of polysilicon adjacent said pedestals;

(d) removing said polysilicon adjacent said pedestals to expose portions of said first mask beneath said removed polysilicon; and (e) oxidizing said structure to form capacitance reduction oxide segments over that portion of the substrate uncovered by removal of said first mask portion adjacent said field oxide and said portions of said first mask layer beneath said polysilicon.

8. The method of claim 7 wherein said step of forming said first mask layer comprises forming a nitride mask layer over said buffer oxide.

9. The method of claim 8 wherein said step of forming said second mask layer comprises forming an oxide layer over said first nitride mask layer.

10. An improved method of constructing one or more bipolar transistors on a semiconductor substrate without damaging areas of the substrate wherein the intrinsic base and emitter regions of the bipolar transistor will be formed which comprises:

(a) forming one or more isolated regions in said substrate wherein a bipolar transistor may be formed which is isolated from other devices formed in adjacent regions;

(b) forming a collector well for said bipolar transistor in said substrate;

(c) forming a first nitride mask having openings therein to expose portions of said substrate to be oxidized to form field oxide portions in the surface of said substrate to further isolate said regions from one another and to isolate said collector well from other elements of said bipolar transistor;

(d) growing said field oxide through said openings in said first nitride mask;

(e) removing said first nitride mask;

(f) growing a first buffer oxide layer over said substrate;

(g) forming a second nitride mask layer over said structure including said buffer oxide;

(h) forming a first oxide mask layer over said second nitride mask layer;

(i) forming a first patterned photoresist mask over said first oxide mask layer;

(j) etching exposed portions of said first oxide mask layer to leave one or more multilayer pedestals under said photoresist mask corresponding to one or more active base/emitter regions to be formed in said substrate;

(k) removing said photoresist mask;

(l) forming a first layer of polysilicon over said structure after etching said first oxide mask to form said multilayer pedestals;

(m) selectively etching said first polysilicon layer to leave rounded spacers adjacent said pedestals;

(n) removing the exposed portion of said second nitride mask layer with a selective etchant which will not substantially attack said remaining portions of said polysilicon adjacent said pedestals;

(o) removing said polysilicon adjacent said pedestals to expose portions of said second nitride mask beneath said removed polysilicon;

(p) oxidizing said structure to form capacitance reduction oxide segments over that portion of said substrate uncovered by removal of said nitride mask portion adjacent said field oxide and said portions of said second nitride mask layer beneath said polysilicon;

(q) removing the remainder of said second nitride mask layer between said field oxide portions and said multilayer pedestals to expose portions of said first buffer oxide layer;

(r) removing said exposed portions of said first buffer oxide layer;

(s) forming a second polysilicon layer over said structure in contact with said substrate in those areas where said first buffer oxide layer was removed;

(t) forming a second buffer oxide layer over said second polysilicon layer;

(u) forming a third nitride layer over said second buffer oxide layer;

(v) forming a planarized layer of photoresist over said third nitride layer;

(w) anisotropically etching said planarized photoresist layer and said underlying third nitride layer until a raised portion of said second buffer oxide layer over said second polysilicon layer and said multilayer pedestal is exposed;

(x) removing said photoresist layer;

(y) wet etching said exposed portion of said second buffer oxide layer over said second polysilicon layer and said multilayer pedestal to expose said underlying polysilicon;

(z) wet etching the portion of said second polysilicon layer exposed by said wet etching of said second buffer oxide layer to expose said multilayer pedestal;

(aa) removing the remainder of said third nitride layer and said second buffer oxide layer;

(bb) removing said oxide mask layer portion of said multilayer pedestals to expose adjacent sidewalls portions of said second polysilicon layer; and (cc) oxidizing said exposed sidewall portions of said second polysilicon layer to provide an insulating layer of oxide between said polysilicon which will comprise a base contact electrode and a subsequently deposited conductive material which will function as an emitter contact electrode.

11. The method of claim 10 including the further steps of:

(a) removing said second nitride mask layer from said multilayer pedestals leaving only buffer oxide over said substrate in those regions where said multilayer pedestals are removed;

(b) implanting an intrinsic base region in said substrate through said buffer oxide;

(c) removing said buffer oxide over said implanted intrinsic base region;

(d) forming a further layer of polysilicon over said intrinsic base region;

(e) doping said further polysilicon layer with a dopant to permit diffusion of an emitter region into said underlying intrinsic base region in said substrate;

(f) patterning said further polysilicon layer to form an emitter electrode;

(g) diffusing an emitter region into said intrinsic base region in said substrate below said doped polysilicon emitter electrode;

(h) forming an oxide layer over said structure; and (i) forming metal contacts to said respective base, collector, and emitter electrodes. through said oxide layer formed thereover.

12. An improved method of constructing one or more integrated circuit components including bipolar and MOS devices on a silicon substrate without damaging areas of the substrate wherein active elements of the integrated circuit components will be formed which comprises:

(a) forming one or more isolated regions in said substrate wherein an integrated circuit device may be formed which is isolated from other devices formed in adjacent regions;

(b) forming a collector well for a bipolar transistor in said substrate;

(c) forming field oxide portions in the surface of said substrate to further isolate said regions from one another and to isolate said collector well from other elements of said bipolar transistor;

(d) forming a buffer oxide layer over exposed portions of said substrate;

(e) forming a first mask layer over said buffer oxide layer;

(f) forming a second mask layer over said first mask layer comprising a different material than the material in said first layer to permit selective etching of either mask layer;

(g) forming a patterned photoresist mask over said second mask layer comprising a different material than the material in said first and second mask layers;

(h) etching exposed portions of said first and second mask layers and buffer oxide layer to leave one or more multilayer pedestals under said photoresist mask corresponding to one or more active regions to be formed in said substrate;

(i) removing said photoresist mask;

(k) forming a polysilicon layer over said structure;

(k) planarizing said polysilicon layer to expose the top of said multilayer pedestals;

(l) masking said structure to expose only collector contact portions of bipolar devices and N channel portions of MOS devices to be formed in said structure;

(m) implanting said exposed portions with an N+ implantation;

(n) heating said structure to anneal said implanted regions and to grow an oxide mask over said implanted portions of said substrate;

(o) removing said mask over said planarized polysilicon;

(p) implanting portions of said structure not covered by said oxide mask with a P+ implantation to form base contacts for said bipolar devices and P channels for MOS devices;

(q) removing said oxide mask and said second mask layer of said multilayer pedestals to expose sidewall portions of said planarized polysilicon adjacent said multilayer pedestals; and (r) oxidizing said exposed sidewall portions and the top of said polysilicon to provide an insulating layer of oxide between said polysilicon which will comprise base, source, and drain contact electrodes respectively for bipolar and MOS devices and a subsequently deposited conductive material which will function respectively as emitter and gate contact electrodes for said bipolar and MOS devices.

13. The method of claim 12 wherein said step of forming said first mask layer comprises forming a nitride mask layer over said buffer oxide.

14. The method of claim 13 wherein said step of forming a second mask layer over said first nitride mask layer comprises forming an oxide mask over said nitride mask.

15. The method of claim 14 wherein said step of etching said oxide and nitride mask layers to form said one or more pedestals includes the steps of etching said oxide mask layer with a first etchant; etching said underlying nitride mask with a second etchant which will remove nitride exposed by removal of said overlying oxide mask layer; and removing portions of said buffer oxide exposed by etching said nitride mask layer.

16. The method of claim 15 wherein said step of P+ implantation further comprises forming a resistor in said substrate beneath one of said removed pedestals and said step of removing said nitride mask portion of said pedestal is followed by a step of growing oxide over said resistor formed in said substrate.

17. The method of claim 15 which includes the further steps of forming one or more Schottky diodes in said structure after formation of said oxide on the sidewalls of said polysilicon and the removal of said nitride mask portion of said pedestals comprising:

(a) forming a further nitride mask over bipolar/MOS/resistor portions of said substrate;

(b) etching said structure to remove said buffer oxide exposed by removal of said nitride mask portions of said pedestals; and (c) forming a Schottky diode by depositing a metal over said structure capable of reacting with said exposed silicon substrate to form a metal silicide electrode which will form a Schottky junction with said silicon to form said Schottky diode.

18. The method of claim 12 wherein said step of forming said field oxide includes the further steps of forming a nitride mask having openings therein to expose portions of said substrate to be oxidized to form said field oxide portions; growing said field oxide through said openings in said nitride mask, forming a photoresist mask over said nitride mask to expose portions of said nitride mask adjacent said newly formed field oxide portios; removing said exposed nitride mask portions; further oxidizing said substrate to form capacitance reduction oxide portions adjacent said field oxide portions over said portions of said substrate newly exposed by removal of said nitride mask portions; and removing the remaining portions of said nitride mask and said photoresist mask before forming said buffer oxide.

19. An improved method of constructing one or more integrated circuit components including a bipolar transistor on a semiconductor substrate without damaging areas of the substrate wherein active elements of the integrated circuit components will be formed which comprises:

(a) forming one or more isolated regions in said substrate wherein an integrated circuit device may be formed which is isolated from other devices formed in adjacent regions;

(b) forming a collector well for a bipolar transistor in said substrate;

(c) forming field oxide portions in the surface of said substrate to further isolate said regions from one another and to isolate said collector well from other elements of said bipolar transistor, said field oxide formation comprising the steps of:

(i) forming a nitride field oxide mask having openings therein to expose portions of said substrate to be oxidized to form said field oxide portions;

(ii) growing said field oxide through said openings in said nitride mask;

(iii) forming a photoresist mask over said nitride mask to expose portions of said nitride mask adjacent said newly formed field oxide portions;

(iv) removing said exposed nitride mask portions;

(v) further oxidizing said substrate to form capacitance reduction oxide portions adjacent said field oxide portions over said portions of said substrate newly exposed by removal of said nitride mask portions; and (vi) removing the remaining portions of said nitride mask and said photoresist mask;

(d) thereafter forming a buffer oxide layer over exposed portions of said substrate;

(e) forming a first mask layer over said buffer oxide layer;

(f) forming a second mask layer over said first mask layer comprising a different material than the material in said first layer to permit selective etching of either mask layer;

(g) forming a patterned photoresist mask over said second mask layer comprising a different material than the material in said first and second mask layers;

(h) etching exposed portions of at least said second mask layer to leave one or more multilayer pedestals under said photoresist mask corresponding to one or more active regions to be formed in said substrate;

(i) removing said photoresist mask;

(j) forming a polysilicon layer over said structure;

(k) planarizing said polysilicon layer to expose the top of said multilayer pedestals;

(l) implanting dopant into portions of said polysilicon corresponding to base contact electrode portions for said bipolar transistor;

(m) removing said second mask portion of said multilayer pedestals by wet etching to expose sidewall portions of said planarized polysilicon adjacent said multilayer pedestals; and (n) oxidizing said exposed sidewall portions of said polysilicon to provide an insulating layer of oxide between said polysilicon which will comprise a base contact electrode and a subsequently deposited conductive material which will function as an emitter contact electrode.

* * * * *